(12) United States Patent
Ramamoorthy et al.

(10) Patent No.: US 7,102,127 B2
(45) Date of Patent: Sep. 5, 2006

(54) MECHANIZED RETRACTABLE PELLICLES AND METHODS OF USE

(75) Inventors: Arun Ramamoorthy, Sunnyvale, CA (US); Hsing-Chien Ma, Fremont, CA (US)

(73) Assignee: Intel Corporation, Santa Clara, CA (US)

( * ) Notice: Subject to any disclaimer, the term of this patent is extended or adjusted under 35 U.S.C. 154(b) by 200 days.

(21) Appl. No.: 10/756,041

(22) Filed: Jan. 13, 2004

(65) Prior Publication Data

US 2004/0229132 A1 Nov. 18, 2004

Related U.S. Application Data

(63) Continuation of application No. 09/840,364, filed on Apr. 23, 2001, now Pat. No. 6,734,445.

(51) Int. Cl.
*B01D 59/44* (2006.01)
*H01J 49/00* (2006.01)

(52) U.S. Cl. ............... 250/281; 250/492.2; 250/492.3

(58) Field of Classification Search ............ None
See application file for complete search history.

(56) References Cited

U.S. PATENT DOCUMENTS

| 4,443,098 A | 4/1984 | Walwyn et al. ........... 355/74 |
| 4,637,713 A | 1/1987 | Shulenberger et al. ..... 355/76 |
| 4,641,930 A | 2/1987 | Podvin et al. ............ 350/529 |
| 4,737,387 A | 4/1988 | Yen ...................... 428/14 |
| 4,831,640 A | 5/1989 | Buckley ................. 378/34 |
| 4,833,051 A | 5/1989 | Imamura ................. 430/5 |
| 4,898,058 A | 2/1990 | Seifert .................. 83/870 |
| 5,042,655 A * | 8/1991 | Beldyk et al. ........... 206/316.1 |
| 5,311,250 A | 5/1994 | Suzuki et al. ............ 355/76 |
| 5,959,721 A | 9/1999 | Nishi ................... 355/53 |
| 6,239,863 B1 | 5/2001 | Catey et al. ............. 355/75 |
| 6,317,197 B1 | 11/2001 | Li et al. ............... 355/74 |
| 6,639,650 B1 * | 10/2003 | Shirasaki ............... 355/30 |

FOREIGN PATENT DOCUMENTS

| JP | 61-216324 | 9/1986 |
| JP | 2000-305249 | 11/2000 |

* cited by examiner

*Primary Examiner*—Nikita Wells
*Assistant Examiner*—Anthony Quash
(74) *Attorney, Agent, or Firm*—Schwegman, Lundberg, Woessner & Kluth, P.A.

(57) ABSTRACT

Apparatus and methods to protect a photomask that is used for semiconductor photolithography at wavelengths outside the visible spectrum include a pellicle that is readily retracted during exposure or to provide access to the photomask. The pellicle can be transparent at an inspection wavelength and opaque at an exposure wavelength. In various embodiments, the pellicle is slid, retracted, or pivoted relative to a base aligned with the photomask, thus uncovering the photomask. When overlying the photomask, the pellicle can be secured with magnetic elements, such as magnets or electromagnets. In another embodiment, the pellicle includes a diaphragm having a plurality of shutter leaves that can be opened or closed. Methods of using a pellicle are also described.

37 Claims, 10 Drawing Sheets

MECHANIZED RETRACTABLE PELLICLES AND METHODS OF USE

RELATED APPLICATIONS

This application is a continuation of U.S. patent application Ser. No. 09/840,364, filed Apr. 23, 2001, now issued as U.S. Pat. No. 6,734,445, which is incorporated herein by reference.

The inventive subject matter is also related to the following applications that are assigned to the same assignee as the present application:

Ser. No. 09/840,373, entitled "Hinged Pellicles and Methods of Use", now U.S. Pat. No. 6,569,582; and Ser. No. 09/840,407, entitled "Dual-Member Pellicle Assemblies and Methods of Use", now U.S. Pat. No. 6,566,018.

TECHNICAL FIELD

The inventive subject matter relates generally to the field of semiconductors and, more particularly, to a mechanized retractable pellicle that can be retracted to uncover a photomask and to methods of use.

BACKGROUND INFORMATION

In semiconductor processing, a photolithographic mask (photomask) is used to pattern a radiation sensitive layer on a semiconductor substrate. Typically, the radiation sensitive layer is called a photoresist layer. A "photomask" is defined herein as the combination of a base and a patterning material. Typically, the base comprises a quartz or glass plate, which is transparent to the exposing radiation, and the patterning material lies on one side of the quartz plate and typically comprises chrome, aluminum, or gold, which is opaque to the exposing radiation. A stepping field is the portion of the patterning material that is used to pattern the photoresist layer.

The photoresist layer is sensitive to photomask defects, such as particles, for example. If a particle is present on a photomask within the stepping field when a photoresist layer is exposed using the photomask, the particle may cause a corresponding image to be formed in the patterned photoresist layer, which in turn may cause the device being fabricated to fail. If the stepping field of the photomask contains only one die, then all die that are fabricated on the semiconductor substrate could fail.

A pellicle is typically used to reduce the likelihood that particles migrate onto the stepping field of a photomask. A "pellicle" is defined herein to include a pellicle frame and a pellicle membrane. The pellicle membrane is typically a thin, flat, usually organic material, such as nitrocellulose or cellulose acetate, and it may be coated with one or more layers of fluoropolymers.

FIG. 1 illustrates a perspective view of prior art semiconductor photolithography equipment 1, including a prior art pellicle. The equipment 1 includes an illumination optical system 2, including a source 4 of photolithographic radiation 6. The equipment 1 further includes a photomask substrate 10 having on its upper surface 12 a photoresist or photolithographic pattern 14. The photomask comprises substrate 10 and photolithographic pattern 14.

To protect the photomask, a pellicle comprising pellicle frame 16 and pellicle membrane 20 is positioned a certain distance over the photomask. Pellicle frame 16 is typically a single-walled frame of metal, metal alloy, or plastic. Pellicle membrane 20 is typically fastened to pellicle frame 16 via an adhesive or adhesive tape (not shown).

A pellicle can protect a photomask from particles existing within the photolithography area. Photolithography is done in an ambient environment where particles are present, even in the cleanest of clean-room environments. Cleaning particles from the photomask can be difficult because of the relatively tight spacing between the photomask and the pellicle membrane. To properly clean a photomask and its pellicle often requires that they be removed from the photolithography area to a mask shop for several hours or even several days, at a significant expenditure of production resources. This can delay the production of semiconductors.

Therefore, there is a significant need for a pellicle that can be readily removed and replaced to facilitate cleaning of the photomask and pellicle membrane.

Further, the line dimensions of semiconductor devices are constantly shrinking. In order to achieve smaller patterning dimensions, photolithography must be carried out at increasingly shorter wavelengths. However, organic pellicle membranes cannot be used for shorter wavelengths. Radiation at such wavelengths is referred to as actinic, in that it can cause a chemical reaction in or near the pellicle membranes, causing them to deteriorate. For example, at approximately 200 nanometers (nm) and below a reaction occurs between the radiation and the air between the photomask and the pellicle membrane, producing ozone that breaks down an organic pellicle membrane. In some instances, the pellicle membrane becomes damaged during only one exposure to actinic radiation. In addition, at very short wavelengths, an organic pellicle is not transparent to the photolithographic radiation, because the pellicle has very high absorption at these wavelengths.

For the reasons stated above, and for other reasons stated below which will become apparent to those skilled in the art upon reading and understanding the present specification, there is a significant need in the art for a pellicle device that adequately protects a photomask, and that does not deteriorate when the photomask is being exposed, as well as for methods of operating such a pellicle device.

DETAILED DESCRIPTION

Figure 1:
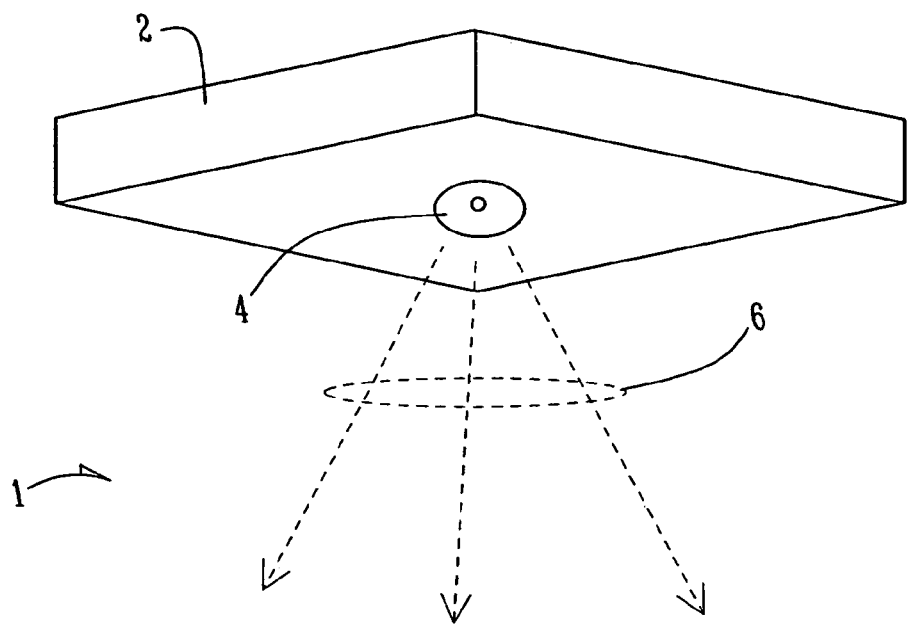
FIG. 1 illustrates a perspective view of prior art semiconductor photolithography equipment, including a prior art pellicle.
Figure 1:
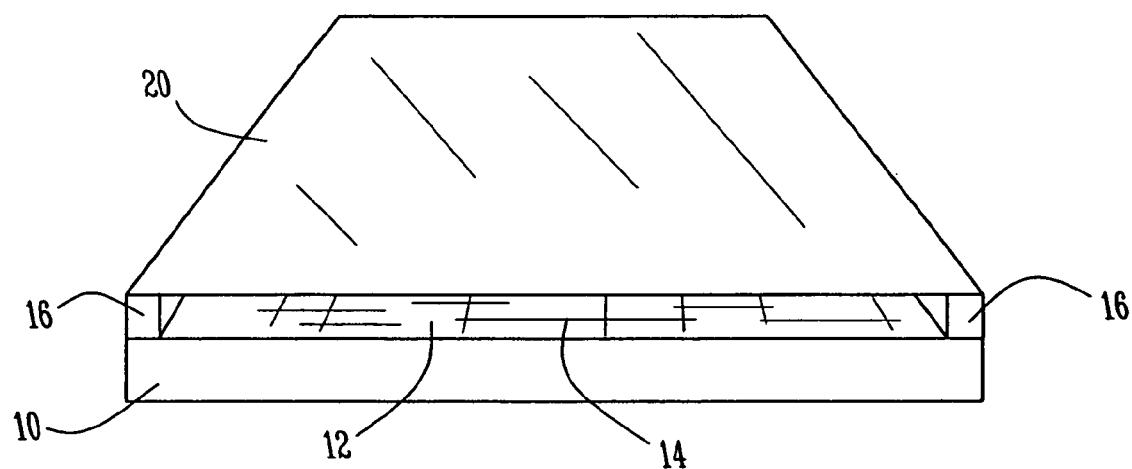

In the following detailed description of embodiments of the invention, reference is made to the accompanying drawings which form a part hereof, and in which is shown by way of illustration specific preferred embodiments in which the inventive subject matter may be practiced. These embodiments are described in sufficient detail to enable those skilled in the art to practice the invention, and it is to be understood that other embodiments may be utilized and that architectural, optical, compositional, mechanical, and electrical changes may be made without departing from the spirit and scope of the inventive subject matter. Such embodiments of the inventive subject matter may be referred to, individually and/or collectively, herein by the term "invention" merely for convenience and without intending to voluntarily limit the scope of this application to any single invention or inventive concept if more than one is in fact disclosed. The following detailed description is, therefore, not to be taken in a limiting sense, and the scope of the present invention is defined only by the appended claims.

The present invention provides a solution to the problem of providing ready access to a photomask that is protected by a pellicle, and to the problem of pellicle membrane deterioration to radiation beyond the visible light spectrum, such as ultraviolet, deep ultraviolet, extreme ultraviolet, X-ray, electron beam, ion beam, and the like. The range being used and being evaluated by current semiconductor photolithography is in the range of 2 to 200 nm, but the invention is not limited to such range.

Various embodiments are illustrated and described herein. Generally, a pellicle overlying a photomask can be retracted to uncover the photomask. In one embodiment, the pellicle frame is slid relative to the photomask to permit the photomask to be accessed or to be exposed to photolithographic radiation, and the pellicle frame is slid back to cover the photomask when it is not being accessed or exposed to photolithographic radiation. In another embodiment, the pellicle frame comprises two or more shutters to move relative to the base between a first position overlying the photomask and a second position not overlying the photomask to expose the photomask to a source of photolithographic radiation. In a further embodiment, the pellicle frame can be pivoted about a vertical axis relative to the base to expose or cover the photomask, respectively. In yet another embodiment, the pellicle frame comprises a diaphragm that opens to expose the photomask. To secure the pellicle frame and the base in alignment, various techniques can be used, including the use of magnetic force and mechanical clamping. Various methods of using a pellicle are also described.

The present invention, as implemented in various embodiments, provides protection of photomasks that are subjected to actinic radiation at the exposure wavelengths mentioned earlier. For photolithographic exposure using either actinic or non-actinic radiation, it provides ready access to the photomask for cleaning, inspection, adjustment, removal, replacement, or other purposes.

Figure 2:
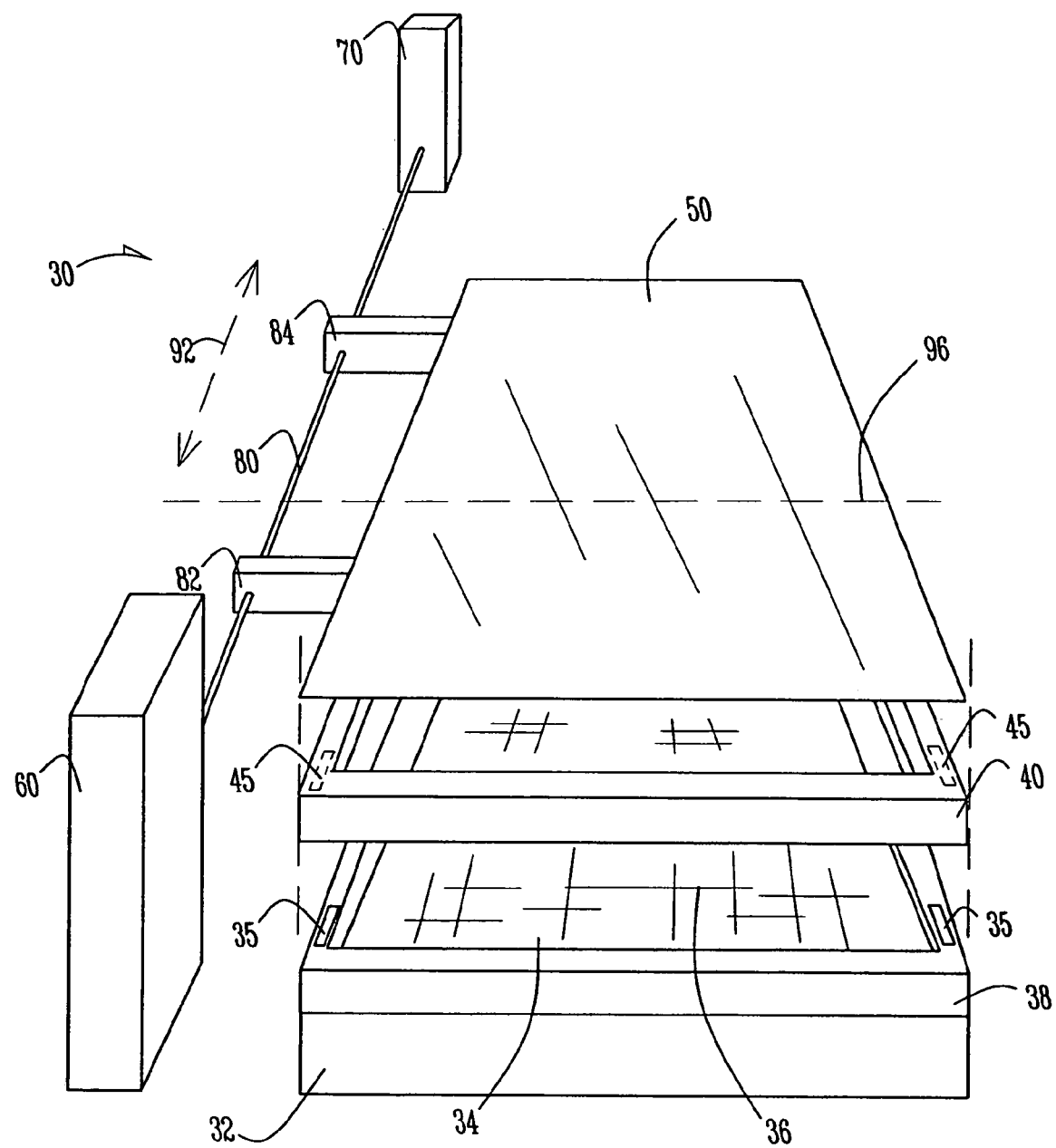
FIG. 2 illustrates a partially exploded perspective view of photolithographic equipment in accordance with one embodiment of the invention.

FIG. 2 illustrates a partially exploded perspective view of photolithographic equipment 30 in accordance with one embodiment of the invention. The equipment 30 can include an illumination optical system (not shown) like that illustrated in FIG. 1. The equipment 30 further includes a photomask base 32 that supports a photomask 34 comprising a photolithographic pattern 36.

A pellicle 50 is suitably coupled to a pellicle frame 40, e.g. by using an adhesive element such as an adhesive or adhesive tape. The adhesive element is preferably non-outgassing and non-particulating. Pellicle frame 40 comprises a pair of arm members or arms 82 and 84 that are coupled to a transport rod 80. While two arms 82 and 84 are illustrated in FIG. 2, in other embodiments more or fewer arms could be used. Although arms 82 and 84 are shown coupled to a long dimension of pellicle frame 40, they could alternatively be coupled to a shorter dimension of pellicle frame 40.

Transport rod 80 is controlled by transport elements or units 60 and 70. Transport units 60 and 70 comprise suitable mechanical, electromechanical, and/or electronic elements to control the desired movement of pellicle frame 40. One of ordinary skill in the art can design and implement suitable transport units 60 and 70, depending upon the requirements of the particular photolithography equipment. Transport rod 80 could comprise a threaded rod to mate with corresponding threaded holes in arms 82 and 84, so that the rotation of transport rod 80 could move pellicle frame 40 in the directions indicated by dashed arrow 92, to either move pellicle 50 to a first position overlying photomask 34 or to move pellicle 50 to a second position not overlying photomask 34 to allow photomask 34 to be accessed (e.g. for cleaning or replacement purposes) or to be irradiated by photolithographic radiation. Other types of transport mechanisms could also be used.

If it is desired to secure pellicle frame 40 with respect to photomask 34, optional photomask frame 38 can be provided. Photomask frame 38 comprises a suitable securing mechanism to keep pellicle frame 40 and photomask 34 in alignment. For example, a magnetic force can be used in the form of permanent magnets 35 on the corners of photomask frame 38 to mate with corresponding magnets 45 of opposite magnetic polarity located on the corners of pellicle frame 40. Magnets, such as magnets 35 and 45, could be located anywhere on pellicle frame 40 and photomask frame 38, such as the corners and/or sides.

While the embodiment shown in FIG. 2 implements a securing mechanism through magnetic fields provided by permanent magnets such as magnets 35 and 45, other suitable securing mechanisms could also be used, such as one or more electromagnets. Also, while the embodiment shown in FIG. 2 places magnets 35 and 45 in photomask frame 38, in another embodiment they could be positioned within photomask base 32, and photomask frame 38 could be eliminated.

In yet another embodiment, a securing mechanism can be implemented through the use of mechanical clamps or other mechanical elements to maintain the pellicle frame in alignment with the photomask. A robot or other form of electromechanical device can be utilized to release the securing mechanism to permit the pellicle frame to be moved away from the photomask.

Pellicle 50 is thus movable relative to the photomask 34, and it can be removed from the path of photolithographic radiation by pivotlessly sliding or retracting it in the direction of transport unit 70. Pellicle 50 is movable between a first position in which pellicle 50 overlies the photomask base 32 and the photomask 34, and a second position wherein pellicle 50 does not overlie photomask 34.

Although photomask base 32 is depicted as relatively thick, it could be only the thickness of the substrate of photomask 34. Alternatively, photomask base 32 can comprise other photolithography equipment in addition to photomask 34. For example, photomask base 32 could comprise a photomask stage for moving or stepping photomask 34 in order to project an image of photolithographic pattern 36 upon a wafer.

Although photomask base 32 is depicted in FIG. 2 as physically supporting photomask 34, the present invention is not limited to such an arrangement. Photomask base 32, for example, could be aligned with but not supporting photomask 34.

Pellicle 50 is formed of a non-particulating material, such as a metal, metal alloy, plastic, quartz, silica glass, plexi-glass, a polymeric film, or other suitable material.

Pellicle 50 can be opaque, transparent, or can comprise a combination of opaque and transparent portions. The terms "opaque" and "transparent" can be relative to either or both the exposure wavelength and an inspection wavelength. Typically an inspection wavelength is in the visible spectrum, but for the present invention it is not limited to the visible spectrum.

In one embodiment, pellicle 50 comprises a transparent portion (not shown) that is commensurate in size with photomask pattern 36. In such embodiment, pellicle 50 is kept in place during inspection using visible radiation, but pellicle 50 is removed during exposure to photolithographic radiation.

In one embodiment, pellicle 50 covers the entire photomask 34. Alternatively, it can cover just the photomask pattern 36.

It will be understood that in FIG. 2 pellicle 50, pellicle frame 40, optional photomask frame 38, photomask 34, and photomask base 32 are illustrated in exploded form, and that in use pellicle 50 will be in contact with pellicle frame 40, photomask 34 will be in contact with photomask base 32, and optional photomask frame 38 will be in contact with photomask base 32.

When pellicle 50 is either in a first position overlying photomask 34 or in a second position away from and not overlying photomask 34, pellicle 34 and pellicle frame 40 can be constructed in such a manner that physical contact is maintained between pellicle 50 and one or more elements of its attendant structure (such as pellicle frame 40) and photomask 34 and one or more elements of its attendant structure (such as photomask base 32 and photomask frame 38).

When pellicle 50 is in the first position, the various elements making up the pellicle device, namely photomask base 32, optional photomask frame 38, pellicle frame 40, and pellicle 50, together form a protective enclosure around photomask 34 to protect photomask 34 from sources of contaminants such as particles. While such elements generally form a more protective enclosure if pellicle 50 and its attendant structure are in physical contact with photomask 34 and its attendant structure, the invention does not require that such elements be in physical contact.

When pellicle 50 is in the second position, it is unnecessary for pellicle 50 and its attendant structure to remain in physical contact with photomask 34 and its attendant structure. However, if desired, pellicle 50 and its attendant structure can remain in physical contact with photomask 34 and its attendant structure, provided that photomask 34 is sufficiently uncovered to allow exposure or access for a particular purpose, such as cleaning.

Figure 3:
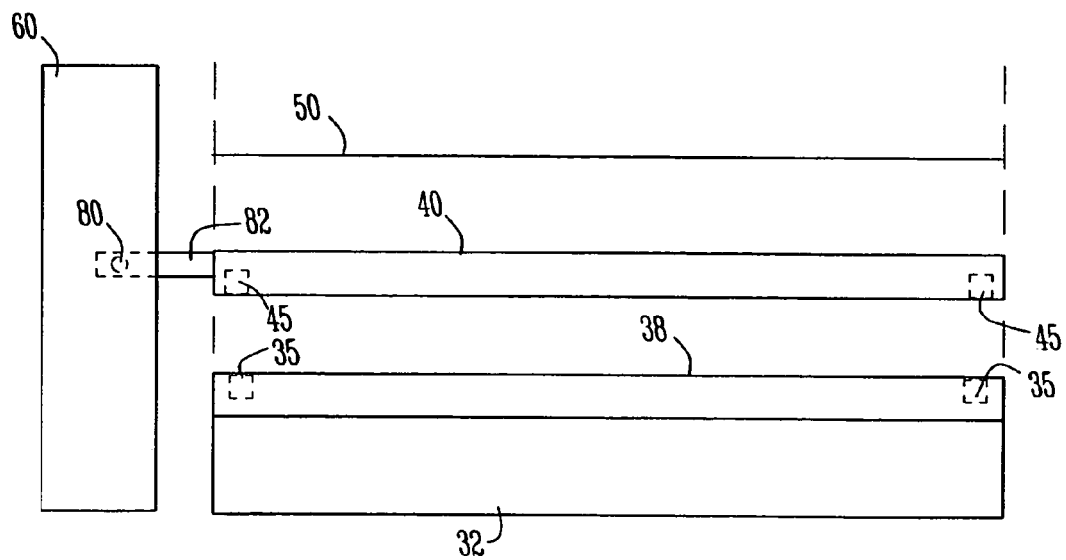
FIG. 3 illustrates a partially exploded frontal view of the photolithographic equipment of FIG. 2.

FIG. 3 illustrates a partially exploded frontal view of the photolithographic equipment 30 of FIG. 2. Pellicle 50 overlies and is secured to pellicle frame 40. Photomask 34 is not seen in FIG. 3, but it overlies and is secured to photomask base 32. Optional photomask frame 38 also overlies and is secured to photomask base 32. Optional photomask frame 38 comprises magnets 35 on or near its upper surface to mate with corresponding magnets 45 on or near the lower surface of pellicle frame 40.

One end of arm 82 is coupled to pellicle frame 40, while the other end is coupled to transport rod 80, which is coupled between transport unit 60 and transport unit 70 (not shown in FIG. 3).

Figure 4:
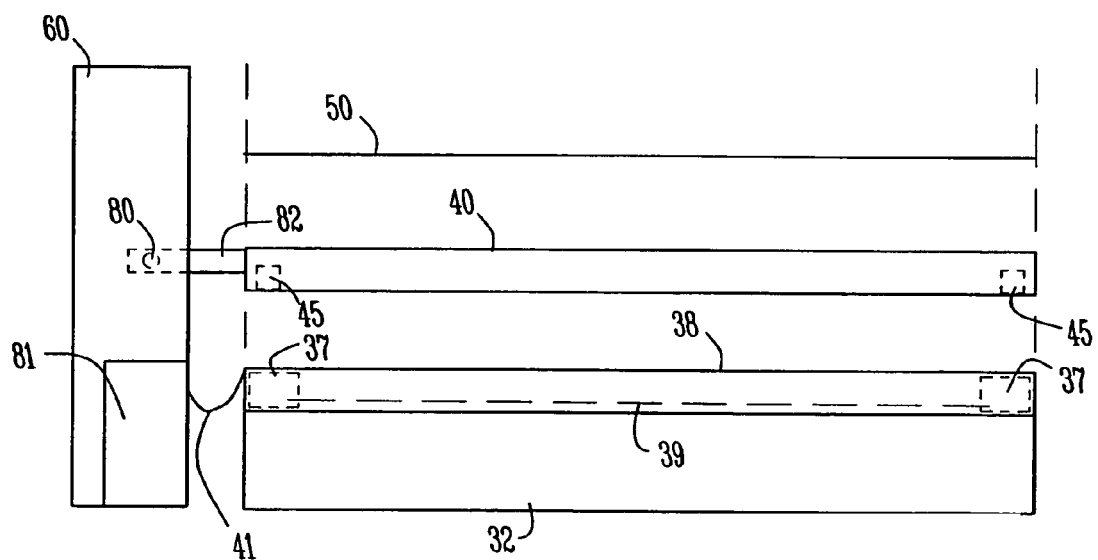
FIG. 4 illustrates a partially exploded frontal view of another embodiment of photolithographic equipment.

FIG. 4 illustrates a partially exploded frontal view of another embodiment of photolithographic equipment. In this embodiment, one or more electromagnets or solenoids have been substituted for one or more permanent magnets in the embodiment illustrated in FIG. 3. For example, in FIG. 4 electromagnets 37 have been substituted for permanent magnets 35 shown in FIG. 3. Electromagnets 37 can be coupled by an internal power cord 39. Electromagnets 37 are coupled via a flexible external power cord 41 to electromagnet control unit 81 of transport unit 60. Electromagnet control unit 81 switches on electromagnets 37 when pellicle frame 40 is overlying photomask base 32 to maintain pellicle 50 over photomask base 32. When pellicle frame 40 is to be moved away from photomask base 32, electromagnet control unit 81 switches off electromagnets 37.

While the embodiment shown in FIG. 4 illustrates electromagnets paired with permanent magnets, ferromagnetic material could be substituted for permanent magnets 45; for example, pellicle frame 40 could be formed, in whole or in part, of steel. The number of electromagnets used could be more or fewer than two. Other elements utilizing magnetic fields could also be substituted for those shown, or they could be used to supplement those shown.

Figure 5:
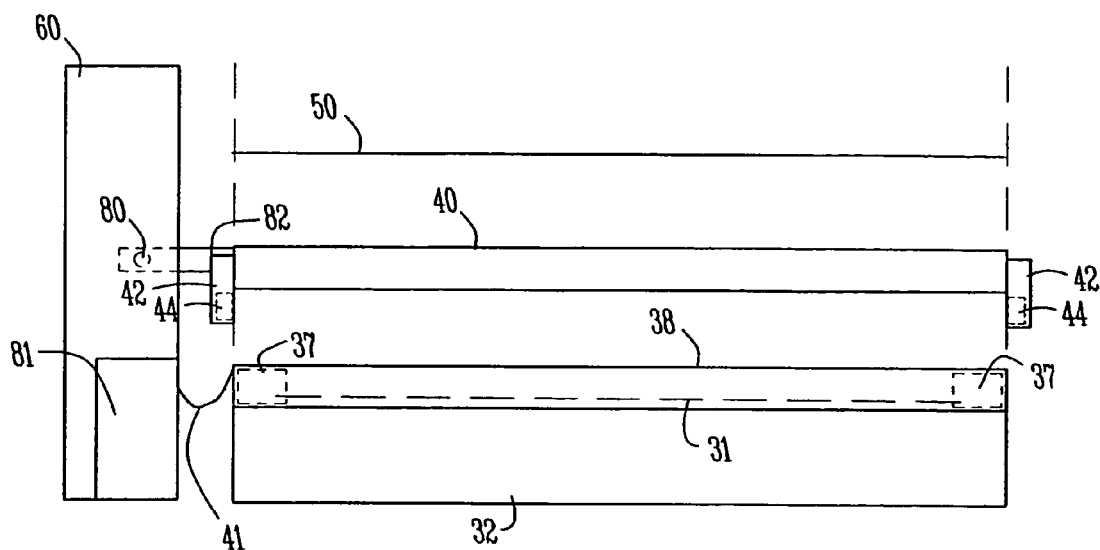
FIG. 5 illustrates a partially exploded frontal view of yet another embodiment of photolithographic equipment.

FIG. 5 illustrates a partially exploded frontal view of yet another embodiment of photolithographic equipment. In this embodiment, pellicle frame 40 comprises a pair of outrigger elements 42 that extend downwardly from pellicle frame 40. A permanent magnet 44 is provided in each outrigger element 42. When pellicle frame 40 is positioned close to the upper surface of photomask frame 38, the magnet 44 of each outrigger element 42 lies immediately adjacent to a corresponding electromagnet 37 of photomask frame 38.

In a manner similar to the operation of the embodiment illustrated in FIG. 4, electromagnet control unit 81 switches on electromagnets 37 when pellicle frame 40 is overlying photomask base 32 to maintain pellicle 50 over photomask base 32. When pellicle frame 40 is to be moved away from photomask base 32, electromagnet control unit 81 switches off electromagnets 37. While the embodiment shown in FIG. 4 illustrates electromagnets paired with permanent magnets, ferromagnetic material could be substituted for permanent magnets 44. The number of electromagnets used could be more or fewer than two. In addition, permanent magnets could be substituted for electromagnets. Other elements utilizing magnetic fields could also be substituted for those shown, or they could be used to supplement those shown.

Alternatively, the outrigger elements 42 could extend down and beneath photomask base 32. Or, instead of being formed on pellicle frame 40, outrigger elements 42 could be formed on photomask frame 38 or photomask base 32, and they could extend upwardly to be secured to suitable elements on pellicle frame 40.

The securing elements, whether in the form of permanent magnets, electromagnets, ferromagnetic material, mechanical clamps, or another type of securing element, could be provided on one or more sides of pellicle frame 40, photomask frame 38, or photomask base 32; in recesses extending into or on protuberances extending from the sides of pellicle frame 40, photomask frame 38, and/or photomask base 32; on the bottom surface of photomask base 32; on the top surface of pellicle frame 40; or any place else within the combination of elements comprising the pellicle frame 40, photomask frame 38, and photomask base 32.

Figure 6:
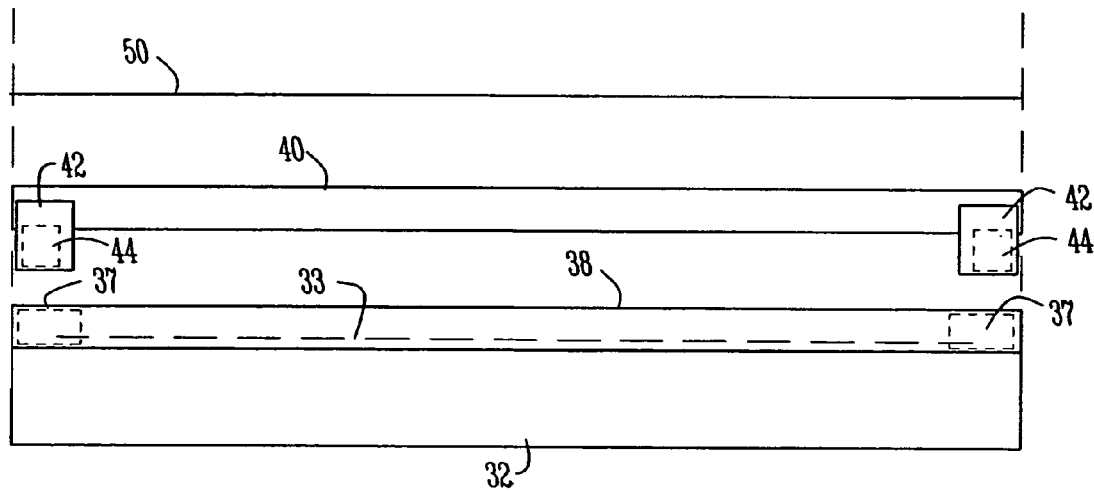
FIG. 6 illustrates a partially exploded side view of the embodiment of photolithographic equipment illustrated in FIG. 5.

FIG. 6 illustrates a partially exploded side view of the embodiment of photolithographic equipment illustrated in FIG. 5. Outrigger elements 42 are shown on the corners of pellicle frame 40. Permanent magnets 44 or ferromagnetic material located in outrigger elements 42 are magnetically held by electromagnets 37, when electromagnets 37 are actuated. Electromagnets 37 can be coupled by internal power cord 33.

Figure 7:
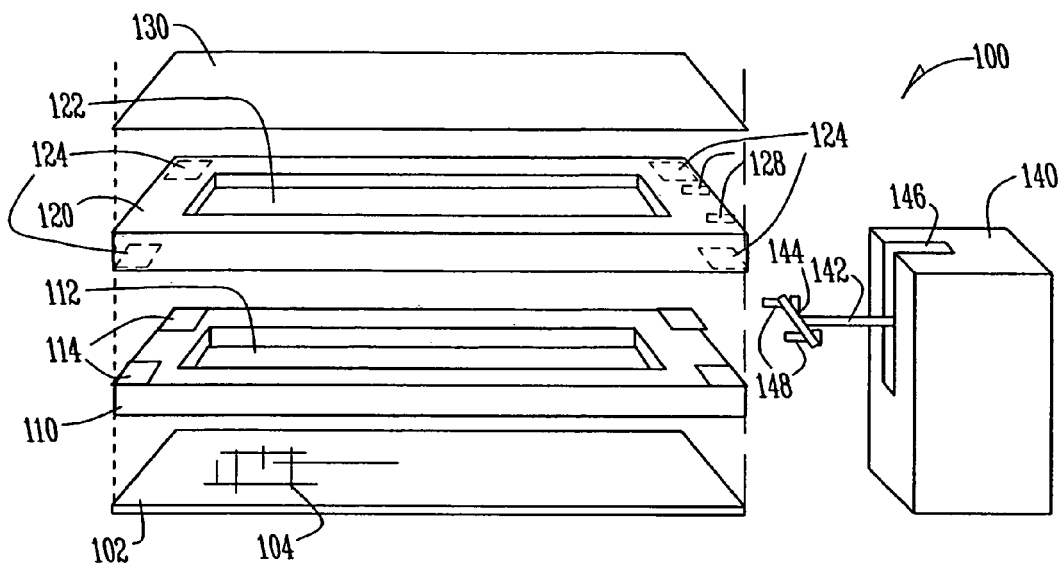
FIG. 7 illustrates a partially exploded perspective view of photolithographic equipment in accordance with one embodiment of the invention.

FIG. 7 illustrates a partially exploded perspective view of photolithographic equipment 100 in accordance with one embodiment of the invention. Photolithographic equipment 100 comprises photomask 102 having photolithographic pattern 104.

Photolithographic equipment 100 further comprises a photomask base member 110 aligned with photomask 102. Base member 110 can be affixed to photomask 102, or base member 110 can merely be aligned with photomask 102. Base member 110 comprises a central opening 112. In one embodiment, base member 110 further comprises a suitable securing mechanism, e.g. magnetic material or magnets 114, for securing base member 110 to pellicle frame 120. Although magnets 114 are depicted as located at the upper surface of the corners of base member 110, in other embodiments magnets 114 could be located below the surface and/or at locations other than at the corners of base member 110.

Photolithographic equipment 100 additionally comprises a pellicle frame 120. Pellicle frame 120 comprises a central opening 122 that can be of equivalent dimensions to central opening 112 of base member 110. Pellicle frame 120 comprises threaded holes 128 in one of its sides.

Pellicle frame 120 can comprise a suitable securing mechanism for securing it to base member 110. In the embodiment shown in FIG. 7, pellicle frame 120 comprises magnets 124 arranged so their poles are of opposite magnetic polarity to adjoining poles of magnets 114. Although magnets 124 are depicted as located at the lower surface of the corners of pellicle frame 120, in other embodiments magnets 124 could be located above the surface and/or at locations other than at the corners of pellicle frame 120. One or more magnets, such as magnets 114 and 124, could be replaced with a solenoid or electromagnet. Alternatively, magnets can be utilized on base member 110, and pellicle frame 120 could comprise ferromagnetic material (e.g. steel or nickel), or vice versa.

Photolithographic equipment 100 also comprises a pellicle 130 that is affixed to pellicle frame 120. While pellicle 130 is depicted in FIG. 7 as affixed to the upper surface of pellicle frame 120, it could alternatively be affixed to the lower surface, or it could be held within the central opening 122 of pellicle frame 120. Pellicle 130 can be of any type of material, such as those materials mentioned earlier.

Photolithographic equipment 100 further comprises transport unit 140 which can be of similar type to transport unit 70 described earlier. Transport unit 140 comprises robot arm 142, which comprises a cross-bar 144 and fasteners 148. Fasteners 148 can be of any suitable type, such as screws, bolts, and the like. Fasteners 148 mate with threaded holes 128 in the side of pellicle frame 120.

Transport unit 140 also comprises a slot 146 to permit robot arm 142 to move pellicle frame 120 off base member 110 and to rotate pellicle frame 120 away from base member 110, when photomask 102 is subjected to photolithographic radiation during exposure, or to allow physical access to photomask 102. Other types of transport mechanisms could be substituted for transport unit 140. For example, pellicle frame 120 could be elevated to sufficient height to allow access to photomask 102.

Together, the various elements making up the pellicle device, namely photomask base 110, pellicle frame 120, and pellicle 130, form a protective enclosure around photomask 102 to protect photomask 102 from sources of contaminants such as particles.

Figure 8:
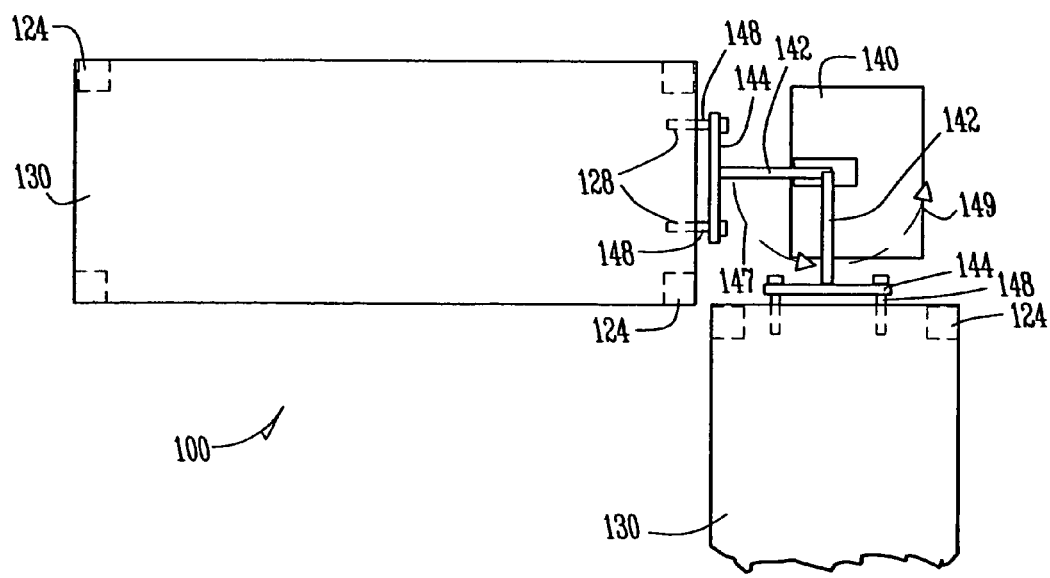
FIG. 8 illustrates a top view of the embodiment of photolithographic equipment illustrated in FIG. 7.

FIG. 8 illustrates a top view of the embodiment of photolithographic equipment 100 illustrated in FIG. 7. In FIG. 8, pellicle 130 is illustrated in two different positions. In a first position, pellicle 130 overlies base member 110 (refer to FIG. 7). In a second position, pellicle 130 has been elevated by robot arm 142 of transport unit 140, and then it has been moved or rotated 90 degrees about a vertical axis in the direction indicated by dashed arrow 147, so that pellicle 130 does not overlie base member 110. Pellicle 130 could also have been rotated another 90 degrees in the direction indicated by dashed arrow 149, in order to further move pellicle 130 away from photomask 102, for example to facilitate cleaning or replacement of photomask 102.

Figure 9:
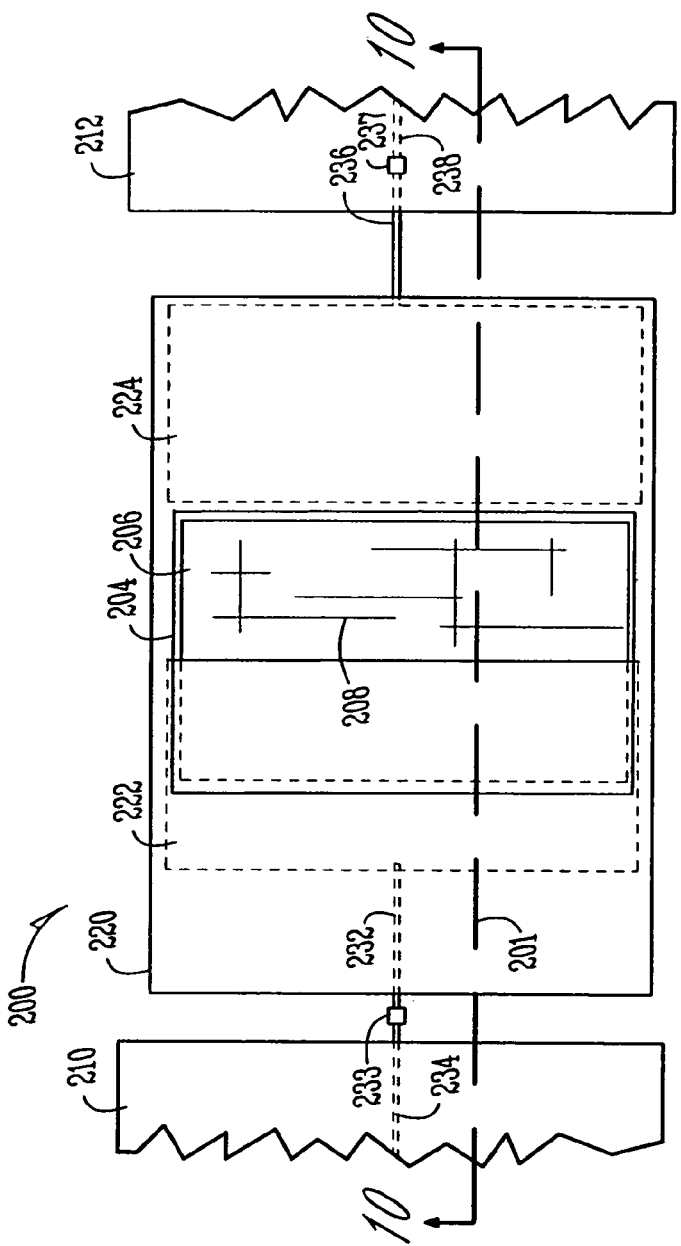
FIG. 9 illustrates a perspective view of photolithographic equipment in accordance with one embodiment of the invention.

FIG. 9 illustrates a perspective view of photolithographic equipment 200 in accordance with one embodiment of the invention. Photolithographic equipment 200 comprises pellicle frame 220, which in turn comprises pellicle elements in the form of shutters 222 and 224. Shutters 222 and 224, when in their closed positions, completely cover the photolithographic pattern 208 of photomask 206 that appears within aperture 204 in pellicle frame 220. In FIG. 9, shutter 222 is shown in a closed position, in which it overlies and covers photomask 206, while shutter 224 is shown in an open position away from photomask 206.

Shutters 222 and 224 can be moved by any suitable transport mechanism. In the embodiment illustrated in FIG. 9, shutters 222 and 224 comprise control rods 232 and 236, respectively. A transport unit 210 comprises a transport rod 234 that is coupled to control rod 232 of shutter 222 via a coupler 233. Similarly, transport unit 212 comprises a transport rod 238 that is coupled to control rod 236 of shutter 224 via a coupler 237. Transport units 210 and 212 open and close shutters 222 and 224, respectively, through suitable movement of transport rods 234 and 238.

While in the embodiment illustrated in FIG. 9, transport units 210 and 212 can independently control the movement of shutters 222 and 224, in another embodiment, they operate in synchronism to open and close shutters 222 and 224. In yet another embodiment, only one transport unit is provided to open and close shutters 222 and 224. In a further embodiment, more or fewer than two shutters are used. Other types of transport mechanisms could also be used.

Figure 10:
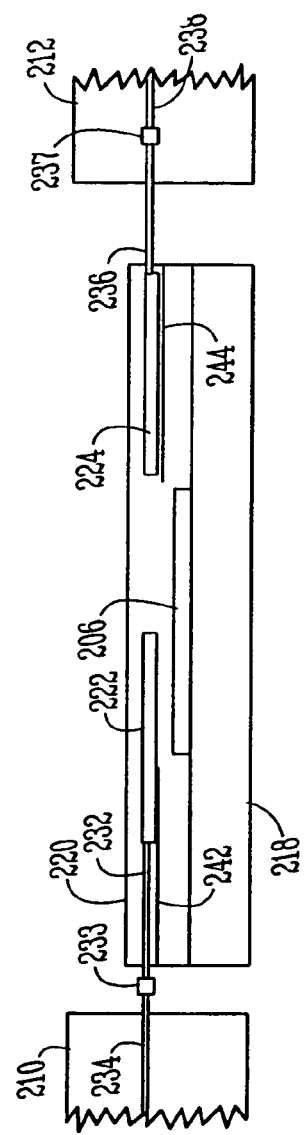
FIG. 10 illustrates a cross-sectional view of the photolithographic equipment illustrated in FIG. 9 taken along line 201 of FIG. 9.

FIG. 10 illustrates a cross-sectional view of photolithographic equipment 200 taken along line 201 of FIG. 9. Shutter 222 rests upon and moves back and forth upon shelf 242, while shutter 224 rests upon and moves upon shelf 244. In another embodiment, shutters 222 and 224 each move within respective retention brackets (not shown) that are coupled to the interior of pellicle frame 220. Photomask 206 lies upon photomask substrate or base 218. Pellicle frame 220, shutters 222 and 224, and photomask base 218 form a protective enclosure around photomask 206 to protect photomask 206 from sources of optical contaminants such as particles.

Figure 11:
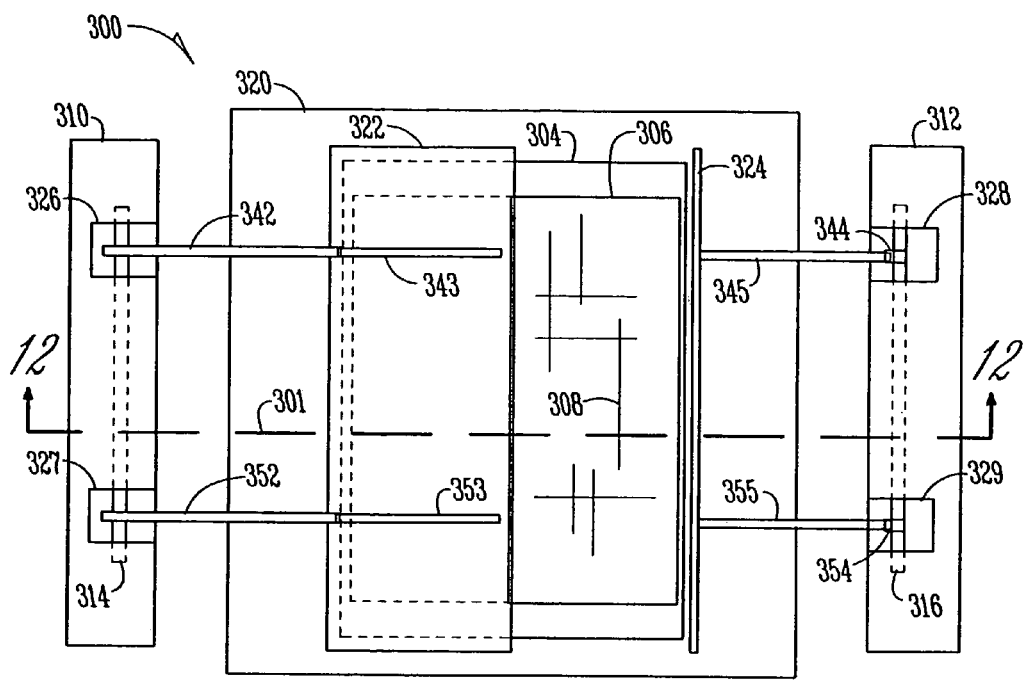
FIG. 11 illustrates a perspective view of photolithographic equipment in accordance with one embodiment of the invention.

FIG. 11 illustrates a perspective view of photolithographic equipment 300 in accordance with one embodiment of the invention. Photolithographic equipment 300 comprises pellicle enclosure 320, which in turn comprises pellicle elements in the form of shutters 322 and 324. Shutters 322 and 324, when in their closed positions, completely cover and protect the photolithographic pattern 308 of photomask 306 that appears within aperture 304 in pellicle enclosure 320. In FIG. 11, shutter 322 is shown in a closed position, in which it overlies and covers photomask 306, while shutter 324 is shown in an open position away from photomask 306.

Shutters 322 and 324 can be moved by any suitable transport mechanism. In the embodiment illustrated in FIG. 11, shutter 322 is coupled to a first articulated arm comprising arm segments 342 and 343, and to a second articulated arm comprising arm segments 352 and 353. Arm segments 342 and 352 are in turn coupled to a transport axle 314 through openings 326 and 327, respectively, of a transport unit 310. When transport axle 314 is rotated by transport unit 310, the articulated arms open or close shutter 322.

Similarly, shutter 324 is coupled to a first articulated arm member or arm comprising arm segments 344 and 345, and to a second articulated arm comprising arm segments 354 and 355. Arm segments 344 and 354 are in turn coupled to a transport axle 316 through openings 328 and 329, respectively, of a transport unit 312. When transport axle 316 is rotated by transport unit 312, the articulated arms open or close shutter 324.

While in the embodiment illustrated in FIG. 11, transport units 310 and 312 can independently control the movement of shutters 322 and 324, in another embodiment, they operate in synchronism to open and close shutters 322 and 324. In yet another embodiment, only one transport unit is provided to open and close shutters 322 and 324. In a further embodiment, more or fewer than two shutters are used. Other types of transport mechanisms could also be used.

Figure 12:
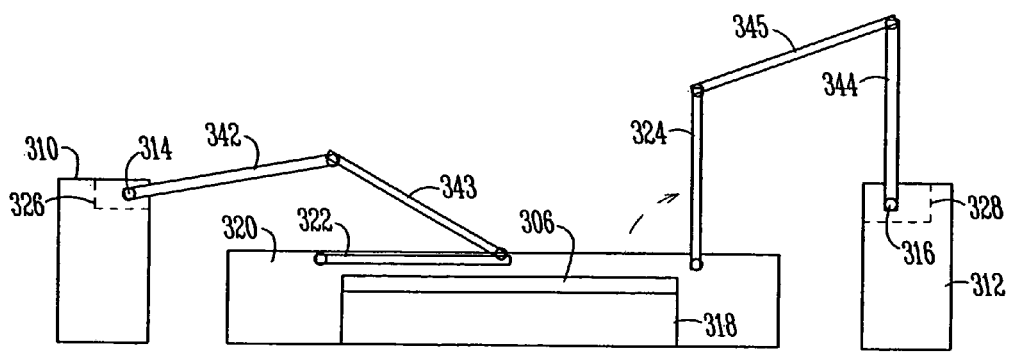
FIG. 12 illustrates a cross-sectional view of the photolithographic equipment illustrated in FIG. 11 taken along line 301 of FIG. 11.

FIG. 12 illustrates a cross-sectional view of photolithographic equipment 300 taken along line 301 of FIG. 1. Photomask 306 lies upon photomask substrate or base 318. Pellicle enclosure 320, including shutters 322 and 324, forms a protective enclosure around photomask 306 to protect photomask 306 from sources of contaminants such as particles.

Figure 13:
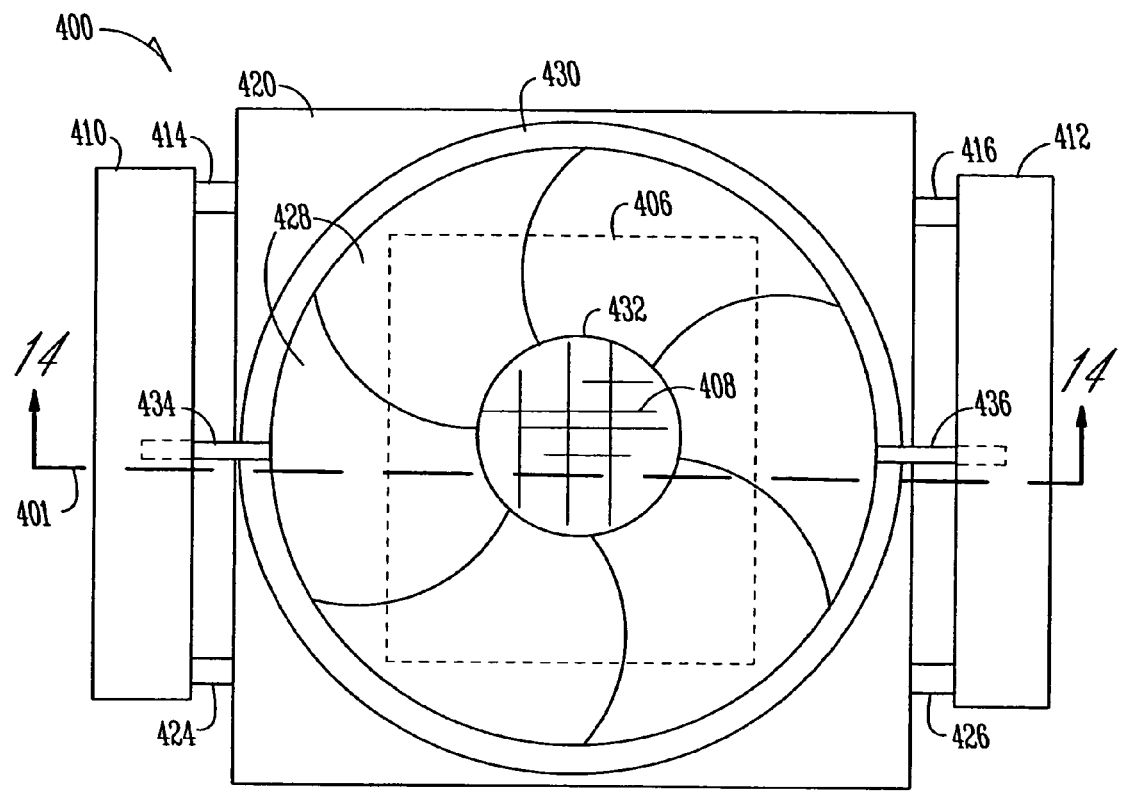
FIG. 13 illustrates a perspective view of photolithographic equipment in accordance with one embodiment of the invention.

FIG. 13 illustrates a perspective view of photolithographic equipment 400 in accordance with one embodiment of the invention. Photolithographic equipment 400 comprises pellicle support 420, which in turn comprises a pellicle in the form of a pellicle diaphragm 430. Pellicle diaphragm 430 comprises a plurality of diaphragm elements or overlapping shutter leaves 428 that can open or close. Pellicle diaphragm 430, when in its closed position, completely covers and protects the photolithographic pattern 408 of photomask 406 that appears within aperture 432 in pellicle diaphragm 420. In FIG. 13, pellicle diaphragm 430 is shown in a partially open position, in which it partially overlies and covers photomask 406.

Pellicle diaphragm 430 can be open and closed by any suitable transport mechanism. In the embodiment illustrated in FIG. 13, pellicle diaphragm 430 is coupled to a pair of transport arms 434 and 436. Transport arms 434 and 436 are in turn controlled and moved by transport units 410 and 412, respectively. Transport unit 410 is structurally coupled to photomask base 418 (FIG. 14) through structural elements 414 and 424. Similarly, transport unit 412 is structurally coupled to photomask base 418 (FIG. 14) through structural elements 416 and 426.

While in the embodiment illustrated in FIG. 13, transport units 410 and 412 together control the movement of pellicle diaphragm 430, in another embodiment only one transport unit is provided to open and close pellicle diaphragm 430. Other types of transport mechanisms could also be used.

Figure 14:
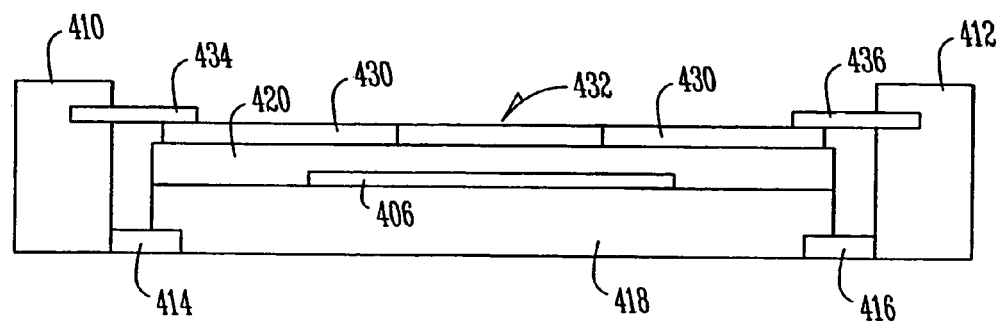
FIG. 14 illustrates a cross-sectional view of photolithographic equipment 400 taken along line 401 of FIG. 13.

FIG. 14 illustrates a cross-sectional view of photolithographic equipment 400 taken along line 401 of FIG. 13. Photomask 406 lies upon photomask substrate or base 418. Pellicle support 420, including pellicle diaphragm 430, forms a protective enclosure around photomask 406 to protect photomask 406 from sources of contaminants such as particles.

Figure 15:
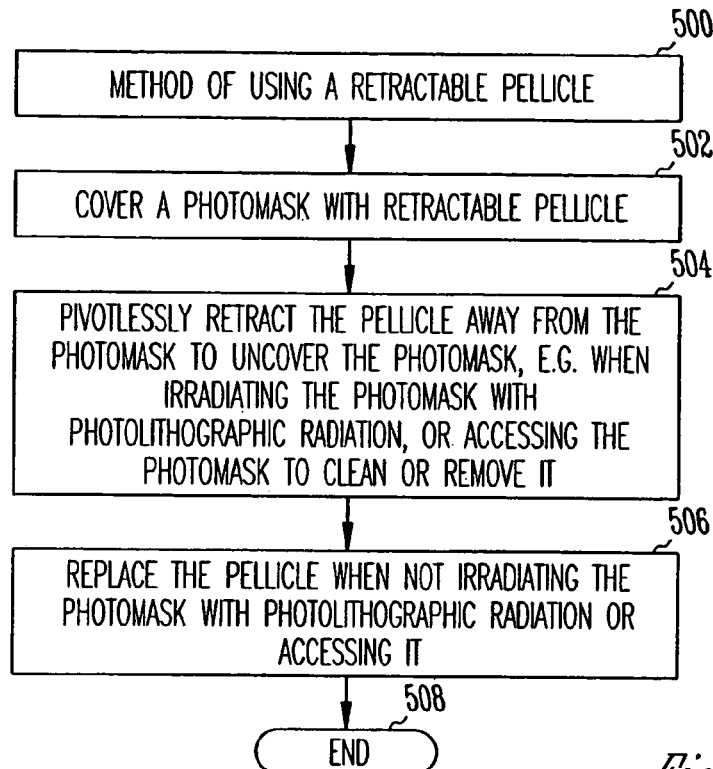
FIG. 15 illustrates a flow diagram of a method of using a retractable pellicle, in accordance with one embodiment of the invention.

FIG. 15 illustrates a flow diagram of a method 500 of using a retractable pellicle, in accordance with one embodiment of the invention. In 502, a photomask is covered with a retractable pellicle. In 504, the pellicle is pivotlessly retracted away from the photomask to uncover the photomask, e.g. when irradiating the photomask with photolithographic radiation, or when accessing the photomask for any purpose, such as to clean or remove it. In one embodiment, the wavelength of the photolithographic radiation is in the range of 2–200 nanometers; however, the invention is not limited to this range of wavelengths. The photolithographic radiation is typically from the group consisting of ultraviolet, deep ultraviolet, extreme ultraviolet, X-ray, electron beam, and ion beam radiation; however, the invention could also be practiced with radiation from the visible spectrum. In 506, the pellicle is replaced when not irradiating the photomask with photolithographic radiation, or when not accessing the photomask, in order to protect the photomask from optical contamination, such as particles. The method ends at 508.

Figure 16:
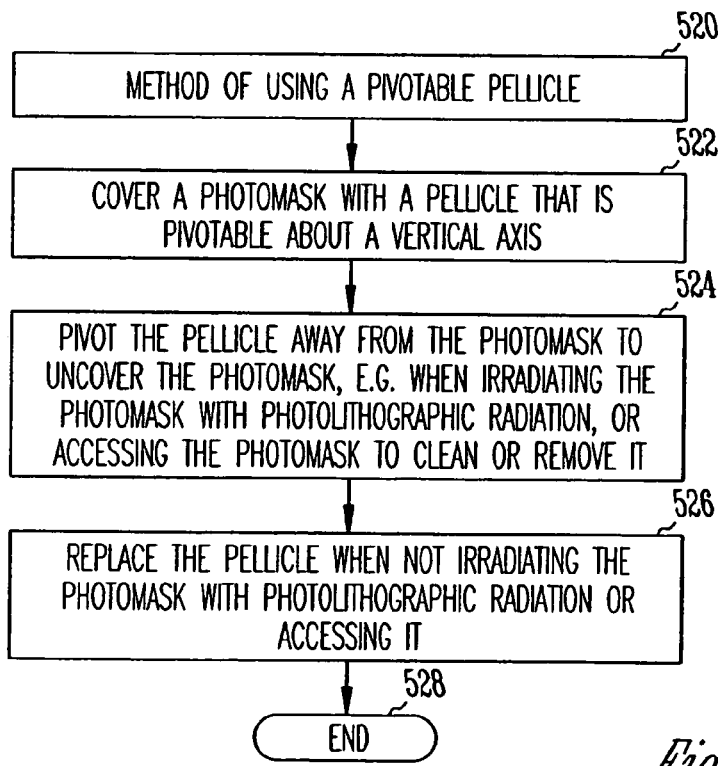
FIG. 16 illustrates a flow diagram of a method of using a pivotable pellicle, in accordance with one embodiment of the invention.

FIG. 16 illustrates a flow diagram of a method 520 of using a pivotable pellicle, in accordance with one embodiment of the invention. In 522, a photomask is covered with a pellicle that is pivotable about a vertical axis. In 524, the pellicle is pivoted away from the photomask to uncover the photomask, e.g. when irradiating the photomask with photolithographic radiation, or when accessing the photomask. In 526, the pellicle is replaced when not irradiating the photomask with photolithographic radiation, or when not accessing the photomask, in order to protect the photomask from optical contamination. The method ends at 528.

Figure 17:
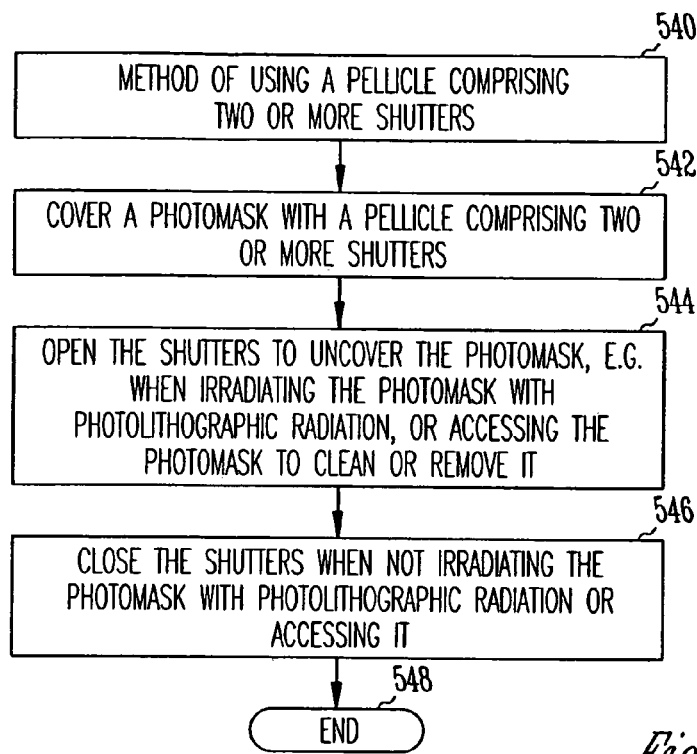
FIG. 17 illustrates a flow diagram of a method of using a pellicle comprising two or more shutters, in accordance with one embodiment of the invention.

FIG. 17 illustrates a flow diagram of a method 540 of using a pellicle comprising two or more shutters, in accordance with one embodiment of the invention. In 540, a photomask is covered with a pellicle comprising two or more shutters. In 544, the pellicle shutters are opened to uncover the photomask, e.g. when irradiating the photomask with photolithographic radiation, or when accessing the photomask. In 546, the pellicle shutters are closed when not irradiating the photomask with photolithographic radiation, or when not accessing the photomask, in order to protect the photomask from optical contamination. The method ends at 548.

Figure 18:
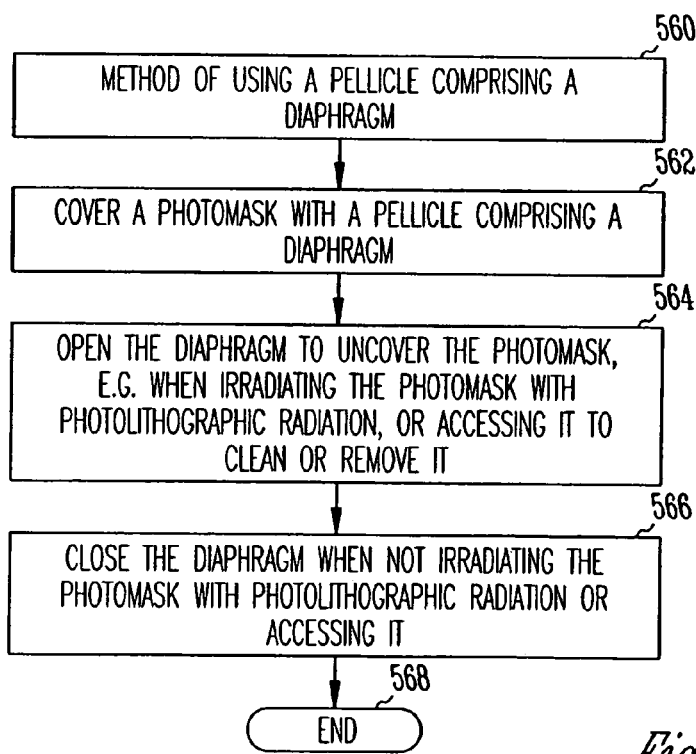
FIG. 18 illustrates a flow diagram of a method of using a pellicle comprising a diaphragm, in accordance with one embodiment of the invention.

FIG. 18 illustrates a flow diagram of a method 560 of using a pellicle comprising a diaphragm, in accordance with one embodiment of the invention. In 560, a photomask is covered with a pellicle comprising a diaphragm. In 564, the pellicle diaphragm is opened to uncover the photomask, e.g. when irradiating the photomask with photolithographic radiation, or when accessing the photomask. In 566, the pellicle diaphragm is closed when not irradiating the photomask with photolithographic radiation, or when not accessing the photomask, in order to protect the photomask from optical contamination. The method ends at 568.

As mentioned above, in addition, or alternatively, to moving and/or opening the pellicle during exposure of the photomask, the pellicle can be moved and/or opened when it is desired to access the photomask or any elements associated therewith, such as for the purpose of cleaning or inspecting the photomask or for other purposes.

Although FIGS. 15–18 depict the methods as having an "end", it will be understood that the methods can be indefinitely repeated.

The present invention provides for apparatus and methods that permit the use of pellicles for photolithographic operations using actinic radiation and/or radiation beyond the visible light spectrum. By employing a movable and/or removable pellicle, the pellicle is not damaged by the photolithographic radiation. In addition, the pellicle can readily be moved and/or removed when it is necessary to access the photomask. In addition, the pellicle can be readily replaced without damaging the photomask. As a result, the invention reduces semiconductor production costs and enables semiconductors to be marketed more competitively and with higher quality than with known apparatus and methods for performing semiconductor photolithography.

As shown herein, the present invention can be implemented in a number of different embodiments, including but not limited to a pellicle device having a pellicle that retracts, slides, or pivots with respect to a photomask; to a pellicle device having a pellicle in the form of a diaphragm or one or more shutters that open and close; and to various methods for using a pellicle. Other embodiments will be readily apparent to those of ordinary skill in the art. For example, the invention could be used with photolithographic radiation within the visible spectrum.

The architecture, composition, materials, dimensions, and sequence of operations can all be varied to suit particular requirements of semiconductor photolithographic environments.

The various elements depicted in the drawings are merely representational and are not drawn to scale. Certain proportions thereof may be exaggerated, while others may be minimized. The drawings are intended to illustrate various implementations of the invention, which can be understood and appropriately carried out by those of ordinary skill in the art.

Although specific embodiments have been illustrated and described herein, it will be appreciated by those of ordinary skill in the art that any arrangement that is calculated to achieve the same purpose may be substituted for the specific embodiment shown. This application is intended to cover any adaptations or variations of the inventive subject matter. Therefore, it is manifestly intended that embodiments of this invention be limited only by the claims and the equivalents thereof.

What is claimed is:

1. A pellicle device comprising:
a base to align with a photomask, the photomask having a surface;
a pellicle to slide relative to the base between a first position overlying the photomask and a second position not overlying the photomask; and
a transport element to move the pellicle between the first and second positions in a direction parallel to the surface of the photomask.

2. The pellicle device of claim 1, wherein the pellicle comprises at least one shutter to open and close.

3. The pellicle device of claim 1, wherein the pellicle comprises a securing mechanism to maintain the pellicle overlying the base when the pellicle is in the first position.

4. The pellicle device of claim 3, wherein the securing mechanism uses at least one magnetic field.

5. The pellicle device of claim 4, wherein the securing mechanism comprises an electromagnet to produce the at least one magnetic field.

6. The pellicle device of claim 4, wherein the securing mechanism further comprises an outrigger element within the at least one magnetic field.

7. A pellicle device comprising:
a base to align with a photomask, the photomask having a surface;
a pellicle to move pivotlessly relative to the base between a first position overlying the photomask and a second position not overlying the photomask; and
a transport element to move the pellicle between the first and second positions in a direction parallel to the surface of the photomask.

8. The pellicle device of claim 7, wherein the transport element comprises at least one arm member coupled to the pellicle.

9. The pellicle device of claim 7, wherein the pellicle does not contact the base in the second position.

10. The pellicle device of claim 7, wherein the pellicle comprises at least one shutter to open and close.

11. The pellicle device of claim 7, wherein the pellicle comprises a securing mechanism to maintain the pellicle overlying the base when the pellicle is in the first position.

12. The pellicle device of claim 7, wherein the pellicle is opaque to photolithographic radiation.

13. The pellicle device of claim 7, wherein a portion of the pellicle is transparent to inspection radiation.

14. A pellicle device comprising:
a base to align with a photomask;
a pellicle to move along a vertical axis relative to the base between a first position overlying the photomask and an intermediate position off the base, and to rotate about the vertical axis between the intermediate position and a second position not overlying the photomask; and
an electro-mechanical transport element to move the pellicle between the first and second positions.

15. The pellicle device of claim 14, wherein the pellicle comprises a securing mechanism to maintain the pellicle overlying the base when the pellicle is in the first position.

16. The pellicle device of claim 15, wherein the securing mechanism uses at least one magnetic field.

17. A pellicle device comprising:
   a base to align with a photomask;
   a pellicle diaphragm comprising at least three overlapping shutter leaves, coupled to the base, the shutter leaves having a closed position to cover the photomask and the shutter leaves having an open position to uncover the photomask.

18. The pellicle device of claim 17, wherein the pellicle device further comprises a transport element coupled to the pellicle diaphragm to open and close the pellicle diaphragm.

19. The pellicle device of claim 17, wherein the base and the pellicle diaphragm form a protective enclosure around the photomask.

20. A method comprising:
   covering a photomask with a pellicle, the photomask having a surface, and the pellicle comprising a pair of shutters; and
   pivotlessly retracting the pellicle shutters away from the photomask in opposing directions that are parallel to the surface of the photomask to uncover the photomask.

21. The method recited in claim 20, wherein the pellicle is retracted to irradiate the photomask with photolithographic radiation.

22. The method recited in claim 21 and further comprising:
   replacing the pellicle to cover the photomask when not irradiating the photomask with photolithographic radiation.

23. The method recited in claim 22, wherein the pellicle is coupled to a transport element, the method further comprising:
   retracting and replacing the pellicle using the transport element.

24. The method recited in claim 20, wherein the wavelength of the photolithographic radiation is within the range of 2 to 200 nanometers.

25. The method recited in claim 20, wherein the photolithographic radiation is from the group consisting of ultraviolet, deep ultraviolet, extreme ultraviolet, X-ray, electron beam, and ion beam.

26. A method comprising:
   covering a photomask with a pellicle, the pellicle being moveable along and pivotable about a vertical axis that is perpendicular to a surface of the photomask;
   moving the pellicle along the vertical axis away from the photomask to partially uncover the photomask; and
   pivoting the pellicle about the vertical axis away from the photomask to fully uncover the photomask.

27. The method recited in claim 26, wherein the photomask is uncovered to irradiate the photomask with photolithographic radiation.

28. The method recited in claim 26 and further comprising:
   replacing the pellicle to cover the photomask when not irradiating the photomask with photolithographic radiation.

29. The method recited in claim 26, wherein the pellicle is coupled to a transport element, the method further comprising:
   pivoting and replacing the pellicle using the transport element.

30. A method comprising:
   covering a photomask with a pellicle comprising a diaphragm having a plurality of shutter leaves; and
   opening the diaphragm shutter leaves to uncover the photomask.

31. The method recited in claim 30, wherein the photomask is uncovered to irradiate the photomask with photolithographic radiation.

32. The method recited in claim 30 and further comprising:
   closing the diaphragm shutter leaves when not irradiating the photomask with photolithographic radiation.

33. The method recited in claim 30, wherein the diaphragm is coupled to a transport element, the method further comprising:
   opening and closing the diaphragm shutter leaves with the transport element.

34. A method comprising:
   covering a photomask with a pellicle, the photomask having a surface, and the pellicle comprising a pair of shutters; and
   pivoting each of the pellicle shutters about an axis parallel to the photomask surface to uncover the photomask.

35. The method recited in claim 34, wherein the photomask is uncovered to irradiate the photomask with photolithographic radiation.

36. The method recited in claim 34 and further comprising:
   replacing the pellicle to cover the photomask when not irradiating the photomask with photolithographic radiation.

37. The method recited in claim 34, wherein the pellicle is coupled to a transport element, the method further comprising:
   pivoting and replacing the pellicle shutters using the transport element.

* * * * *

UNITED STATES PATENT AND TRADEMARK OFFICE
CERTIFICATE OF CORRECTION

| | | |
|---|---|---|
| PATENT NO. | : 7,102,127 B2 | Page 1 of 1 |
| APPLICATION NO. | : 10/756041 | |
| DATED | : September 5, 2006 | |
| INVENTOR(S) | : Ramamoorthy et al. | |

It is certified that error appears in the above-identified patent and that said Letters Patent is hereby corrected as shown below:

Title page, Item (56), under "Foreign Patent Documents", in column 2, line 1, after "9/1986" insert -- H01L 21/30 --.

Title page, Item (56), under "Foreign Patent Documents", in column 2, line 2, after "11/2000" insert -- G03F 1/08 --.

Signed and Sealed this

First Day of July, 2008

JON W. DUDAS
*Director of the United States Patent and Trademark Office*